United States Patent
Parker (10) Patent No.: US 6,671,207 B1
(45) Date of Patent: Dec. 30, 2003

(54) PIGGYBACK PROGRAMMING WITH STAIRCASE VERIFY FOR MULTI-LEVEL CELL FLASH MEMORY DESIGNS

(75) Inventor: Allan Parker, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/779,884

(22) Filed: Feb. 8, 2001

(51) Int. Cl.[7] .............................................. G11C 16/06
(52) U.S. Cl. ............................ 365/185.22; 365/185.03; 365/185.19
(58) Field of Search ........................ 365/185.22, 185.03, 365/185.04, 185.19, 185.18, 185.01, 185.33

(56) References Cited

U.S. PATENT DOCUMENTS

| | | | | |
|---|---|---|---|---|
| 5,523,972 A | * | 6/1996 | Rashid et al. | 365/185.22 |
| 5,768,191 A | * | 6/1998 | Choi et al. | 365/185.22 |
| 6,370,081 B1 | * | 4/2002 | Sakui et al. | 365/238.5 |
| 6,373,746 B1 | * | 4/2002 | Takeuchi et al. | 365/185.03 |
| 6,418,053 B1 | * | 7/2002 | Parker | 365/185.19 |
| 6,466,483 B1 | * | 10/2002 | Parker | 365/185.28 |
| 6,542,403 B1 | * | 4/2003 | Parker | 365/185.03 |
| 6,552,929 B1 | * | 4/2003 | Parker | 365/185.03 |

* cited by examiner

Primary Examiner—Hoai Ho
Assistant Examiner—Gene N. Auduong (57) ABSTRACT

A method of program verifying a memory cell that includes generating a program verify pulse with stepped portions and programming the memory cell with the program verify pulse.

48 Claims, 4 Drawing Sheets

PIGGYBACK PROGRAMMING WITH STAIRCASE VERIFY FOR MULTI-LEVEL CELL FLASH MEMORY DESIGNS

BACKGROUND OF THE INVENTION

1. Field of the Invention

The present invention relates to the field of non-volatile memory devices. More particularly, the invention relates to a method of programming multi-bit flash electrically erasable programmable read only memory (EEPROM) cells that utilize the phenomena of hot electron injection to trap charge within a trapping dielectric material within the gate.

2. Discussion of Related Art

Memory devices for non-volatile storage of information are currently in widespread use today, being used in a myriad of applications. A few examples of non-volatile semiconductor memory include read only memory (ROM), programmable read only memory (PROM), erasable programmable read only memory (EPROM), electrically erasable programmable read only memory (EEPROM) and flash EEPROM.

Semiconductor EEPROM devices involve more complex processing and testing procedures than ROM, but have the advantage of electrical programming and erasing. Using EEPROM devices in circuitry permits in-circuit erasing and reprogramming of the device, a feat not possible with conventional EPROM memory.

Flash EEPROMs are similar to EEPROMs in that memory cells can be programmed (i.e., written) and erased electrically but with the additional ability of erasing all memory cells at once, hence the term flash EEPROM. A Flash device is a non-volatile memory comprising an array of cells that can store a pre-determined number of logic "0"'s and "1"'s. The stored "1"s and "0"s maintain their state in the absence of external power. These bits can be modified millions of times over the life-time of the device.

Figure 1:
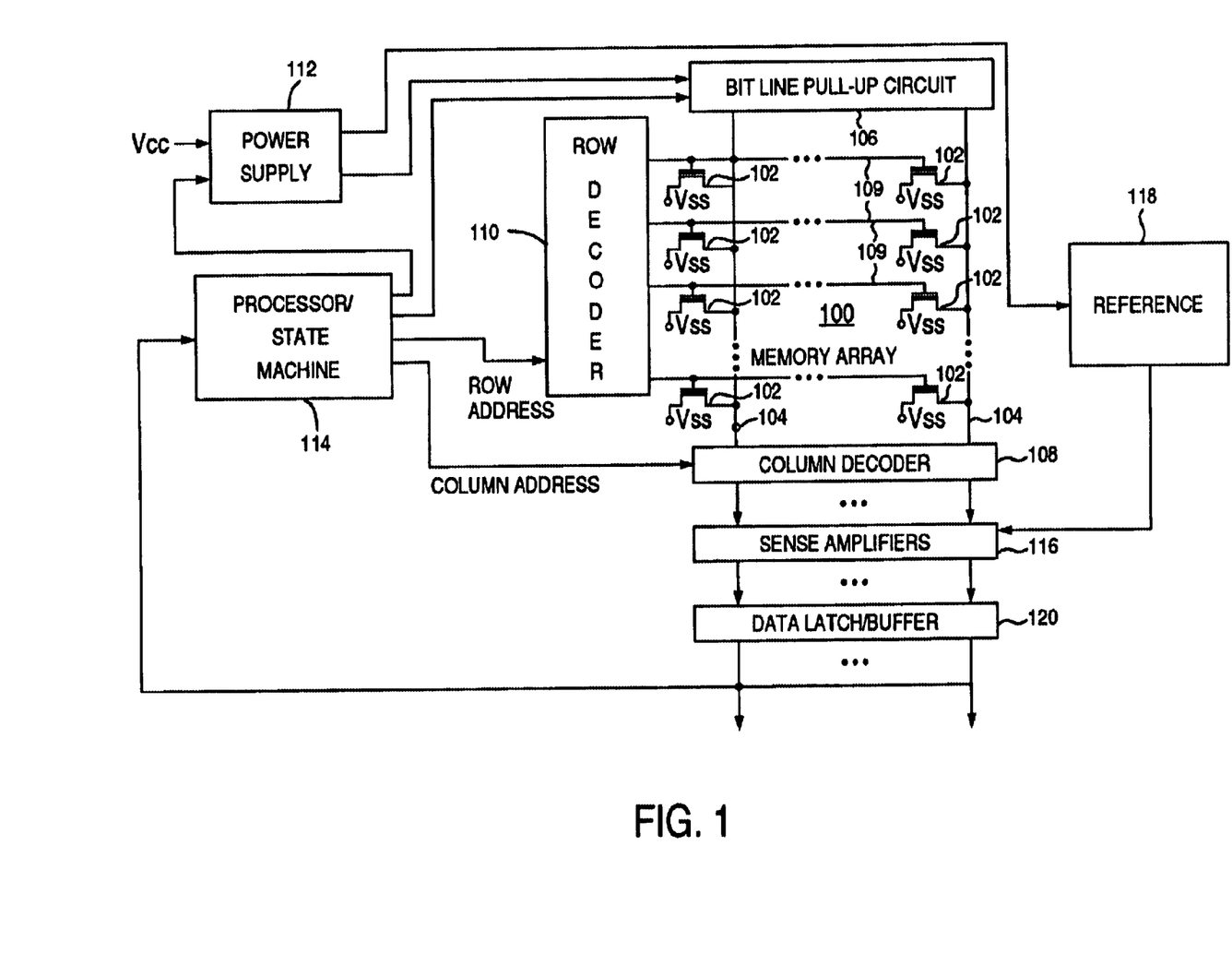
FIG. 1 schematically illustrates an embodiment of an integrated circuit with a flash memory array that is programmed in a manner in accordance with the present invention.

An example of a typical configuration for an integrated circuit including a multi-level cell flash memory array 100 and circuitry enabling programming, erasing, and reading for memory cells in the array 100 is shown in FIG. 1. The flash memory array 100 includes individual cells 102. Each cell 102 has a drain connected to a bitline 104, each bitline being connected to a bitline pull up circuit 106 and column decoder 108. The sources of the array cells are connected to Vss, while their gates are each connected by a wordline 109 to a row decoder 110.

The row decoder 110 receives voltage signals from a power supply 112 and distributes the particular voltage signals to the wordlines as controlled by a row address received from a processor or state machine 114. Likewise, the bitline pull up circuit 106 receives voltage signals from the power supply 112 and distributes the particular voltage signals to the bitlines as controlled by a signal from the processor 114. Voltages provided by the power supply 112 are provided as controlled by signals received from processor 114.

The column decoder 108 provides signals from particular bitlines 104 to sense amplifiers or comparators 116 as controlled by a column address signal received from processor 114. The sense amplifiers 116 further receive voltage reference signals from reference 118. The outputs from sense amplifiers 116 are then provided through data latches or buffers 120 to processor 114.

As mentioned above, the memory array 100 includes multi-level storage cells 102. Multi-level storage refers to the ability of a single memory cell 102 to represent more than a single binary bit of data. A conventional memory cell depicts two states or levels, usually referred to as logic "0" and logic "1". A multi-level cell could represent as many as 256 states, or a byte of information.

Multi-level cell storage is obtainable in flash design because a flash memory cell can be programmed to provide multiple threshold voltage (vt) levels. The different vt levels can be sustained over time in a flash memory cell 102, even after repeated accesses to read data from the cell. For example, 16 vt levels stored in a flash memory cell can represent data in four conventional memory cells. Thus, an array of multi-level flash memory cells 102 which can store up to 16 vt levels can provide 4 times the storage capacity of conventional memory cells which only store a binary bit per cell. An example of a multi-level memory array is discussed in U.S. Pat. No. 5,973,958, the entire contents of which are incorporated herein by reference.

Programming of the flash memory array 100 is executed on a word-line basis. The word-line 109 is considered the row address. The word-line will cross multiple bit-lines 104. The bit-line 104 is considered the column address. Each bit-line 104 contains buffer logic to interface to the selected core cell during program, read and erase operations.

Figure 2:
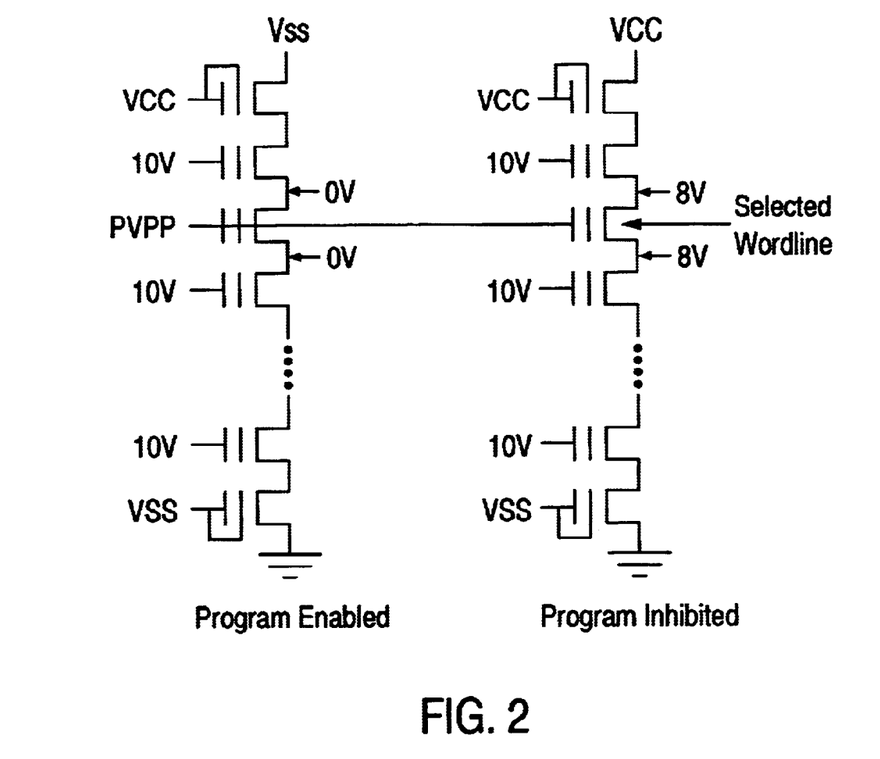
FIG. 2 schematically shows a known method of programming the flash memory array of FIG. 1.

FIG. 2 illustrates a selected and unselected bit-line during programming. The unselected bit (bit not to be programmed) is considered inhibited. The bit-line is inhibited from the effects of the program pulse. The selected bit (bit to be programmed) is referred to as uninhibited. This bit will be programmed during the program pulse.

To program a multi-level cell in the flash memory array 100, high gate-to-drain voltage pulses are provided to the cell from power supply 112 while a source of the cell is grounded. For instance, during programming typical gate voltage pulses of 18V are each applied to a cell, while a drain voltage of the cell is set to 3.3V and its source is grounded.

As shown in FIG. 2, the program voltage PVpp of 18V will be applied to the selected word-line (column address). A substantially lesser voltage, such as 10V, will be applied to unselected word-lines. An uninhibited word-line will have a strong field generated across the device. In particular, FIG. 2 shows that with Vss of 0V being applied to one end of a bit-line 109 to be uninhibited, the source/drain regions of the bit-line will couple to 0V or ground. This will make the applied field appear much stronger so that effective programming can occur. A high field generated across the memory device will cause electron injection into the floating gate of the selected cell exponentially proportional to strength of the field. This programming procedure results in an increase of a threshold voltage for the cell, the threshold being the gate-to-source voltage required for the cell to conduct.

Each programmed cell requires a specific amount of applied electric field to obtain the desired programmed vt level. The amount of electric field determines the program speed of a bit-cell. Fast cells will need less applied field while slow cells will need more. The electric field is applied through several program pulses. The use of program pulses allows the device to control program distributions. After each pulse, the cells are program-verified to see if the target vt has been achieved. Using multiple program pulses allows the device to stop programming fast bits while completing the programming the slow bits.

Figure 3:
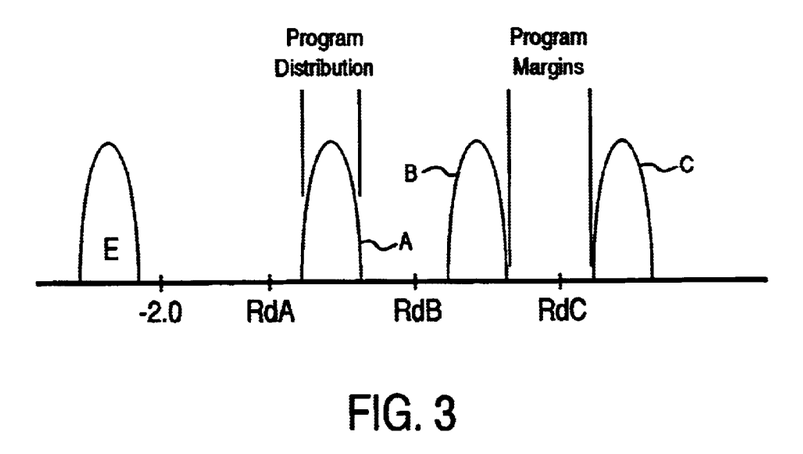
FIG. 3 schematically shows a known method of programming a multi-level cell used in the flash memory array of FIG. 1.

Program-verify allows the device to stop programming specific bit-cells when a desired level has been obtained. All memory cells start in the Erase State (E) as seen in FIG. 3. Depending on data, specific bits will be programmed to the higher 3 states. Once programmed, these bits can be read by the external system.

To program each memory cell, it can take several program pulses. After each program pulse, a program-verify evaluation occurs. As in FIG. 4, the program-verify guarantees that each cell is at a minimum (PgVfyA) vt state. Program-verify is needed because of variation in program speeds among the bit-cell population. Fast bits may achieve the desired vt level in 5 program pulses. Slow bit-cells may require 10 program pulses to complete. Program verify allows specific bits to be disabled from further programming when the desired vt level is achieved.

Figure 4:
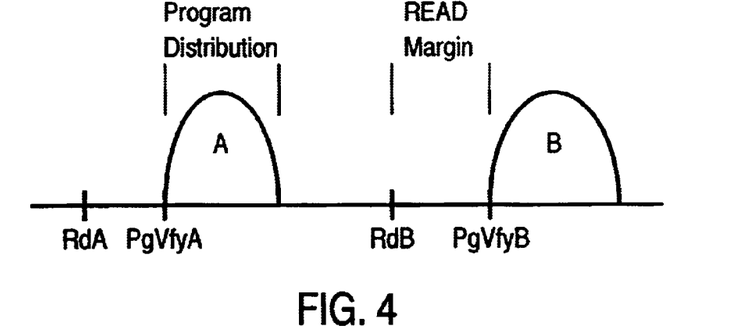
FIG. 4 schematically shows a known method of program-verifying a multi-level cell used in the flash memory array of FIG. 1.

FIG. 4 indicates the difference between the read and program-verify levels. The difference between the read and program-verify level is chosen to supply a margin to compensate for reliability and functional variations. (i.e., VCC, temperature) A program-verify occurs after each program pulse to determine if the selected bit is at the desired vt level.

Conventional program flows have each level programmed separately. This can be seen in FIG. 5 where programming pulses of 20V, 19V and 18V for programming levels C–A, respectively, are generated. The programming pulses of 20V, 19V and 18V has a corresponding program verify pulse LC, LB and LA, respectively. The program verify pulse LC has a constant voltage of approximately 2.1V and a width of approximately 5 $\mu$s, program verify pulse LB has a constant voltage of approximately 1.2V and a width of approximately 5 $\mu$s and program verify pulse LA has a constant voltage of approximately 0.4V and a pulse width of approximately 5 $\mu$s. If 10 pulses are required to program each level, then programming would constitute initially applying ten of the 20V and LC pulse pairs to program level C. Next, ten of the 19V and LB pulse pairs are applied to program level B. Finally, ten of the 18V and LA pulse pairs are applied to program level A. Thus, the total program time would take the time elapsed for 30 program pulses and 30 program verify pulses.

An inhibited word-line will not have a strong field across the device. FIG. 2 shows that with VCC of 3.3V being applied at one end of a bit-line 109 to be inhibited, the source/drain regions of bit-line will couple to 8V. This will make the applied field appear much weaker and no effective programming will occur.

As explained above, a multi-level cell 102 utilizes $2^N$ VT levels to represent N logical bits. Standard program times of multi-level cell designs are $2^N-1$ times that of a single bit program time (SBPT). An example of known programming of two logical bits (N=2) in a single multi-level cell 102 is shown in FIG. 3. In particular, four programming charge distributions A, B, C and E are formed. The centers of the programming charge distributions A–C are preferably positioned between the centers of the charge distributions for the reading pulses. The centers of the charge read distributions are labeled RdA, RdB and RdC corresponding to Read Level A, Read Level B and Read Level C, respectively. RdA typically has a value of approximately 0V, RdB a value of approximately 800 mV and RdC a value of approximately 1.6V. Besides wanting the centers of the program distributions A–C to be positioned between Read Levels A–C, it is desired that there be no intersection between the programming and read distributions so that the read process can accurately predict the levels of the memory cell are properly programmed.

Table 1 is given below that shows a preferred correspondence between the levels A–C and E and the accessed logical bit values Q1, Q2.

TABLE 1

| Level | Vt | Q2 | Q1 |
|---|---|---|---|
| C | 2.0 V | 0 | 0 |
| B | 1.0 V | 0 | 1 |
| A | 0 V | 1 | 0 |
| E | <−2.0 V | 1 | 1 |

Since charge distribution E is the erase state and considered the default setting, there are $2^N-1$ levels or in the case of N=2 three levels A–C ($2^2-1$) that must be programmed depending on loaded data. In a known manner of programming, each of the $2^2-1$ levels are programmed separately. Each level is programmed separately so that the inhibited and uninhibited bit-lines can be set. This separate programming results in the total programming time being equal to ($2^N-1$)*SBPT (single bit program time). As N, the number of logical bits increases, the programming time becomes exponentially larger and more burdensome. For example, a 4-bit (N=4) multi-level cell design can have a programming time that is $2^4-1$ times greater than that of a 2-bit multi-level cell design. Accordingly, there is a need for reducing the programming time for multi-level cells that are programmed for multiple bits.

Please note that in order to achieve the above programming one or more pulses are applied to each vt level separately. In the case of N=2, initially pulses of a voltage, such as 20V, are applied to the highest vt level C. After level C is programmed, one or more pulses of a voltage, such as 19V, are applied to the next lowest level B until level B is programmed. Next, one or more pulses of a lower voltage, such as 18V, are applied to the lowest level C until level C is programmed. Note that the voltages of the pulses are dependent on the desired speed of programming. Note that the highest vt level pulse is adjusted so that the selected bit cells will complete programming in ½ the pulse count of the successive vt levels. For example, if the pulse target is 10, the high vt level bits will be targeted for completion of programming in 5 pulses. If the high vt level programming speed increases (fewer pulses), the program voltage can be adjusted to slow successive level programming and insure proper distributions for the lower vt levels.

To erase a cell in the flash memory array 100, the programming process described above is reversed. In the case of N=2, the highest level vt level C is erased by applying pulses of 20V to the substrate while the gate is grounded.

To read the state of a cell, a typical control gate voltage of Rd levels is applied to the cell. The current output from the cell being read is received at an input of a number of the sense amplifiers 116 connected to the same bitline as the cell being read. A second input to each sense amplifier is provided from the reference 118. The reference 118 provides a different reference current to each sense amplifier connected to a bit line, with a current level set equal to current expected from a cell being read when programmed to a desired threshold voltage state. Binary outputs of the sense amplifiers 116 indicate if the cell being read is in a state that is greater than or less than the state of the reference signal received. Outputs of the sense amplifiers are provided through data latch/buffers 120 to the processor 114, enabling the processor 114 to determine from the sense amplifier outputs the threshold state of the cell being read.

SUMMARY OF THE INVENTION

One aspect of the present invention regards a method of program verifying a memory cell that has $2^N$ voltage levels where N>1 and represents the number of bits stored within the memory cell. The method includes generating a program verify pulse and program verifying at least two of the $2^N$ voltage levels with the program verify pulse.

A second aspect of the present invention regards a method of program verifying a memory cell that includes generating a program verify pulse with stepped portions and program verifying said memory cell with the program verify pulse.

Each of the above aspects of the present invention provides the advantage of reducing the programming and program verify times of a multi-level memory cell and memory array.

The present invention, together with attendant objects and advantages, will be best understood with reference to the detailed description below in connection with the attached drawings.

DETAILED DESCRIPTION OF THE INVENTION

The following description of the method of the present invention will be with respect to the multi-level memory array 100 shown in FIG. 1. It should be understood that the present invention can be applied to other embodiments of memory structures as well.

Figure 6:
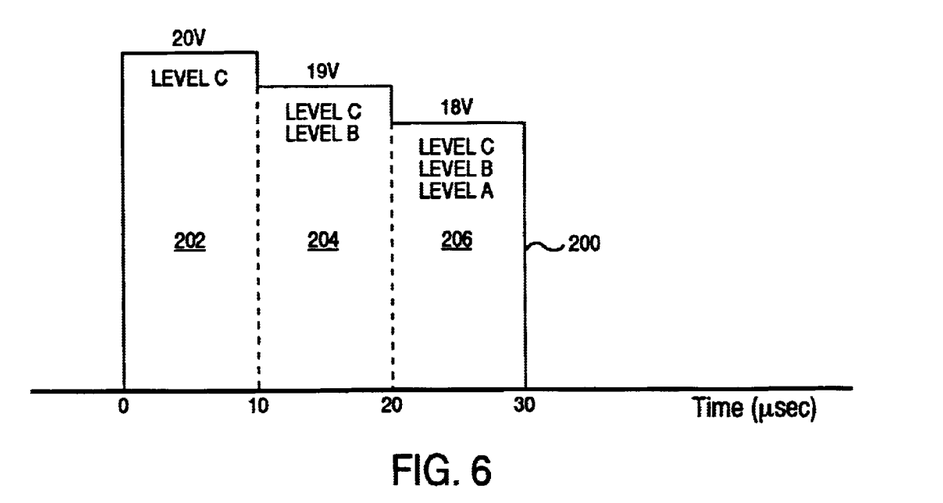
FIG. 6 shows an embodiment of a "piggyback" pulse that is used with a mode of programming in accordance with the present invention.

Programming of the memory array 100 according to the present invention is accomplished by applying a "piggyback" pulse 200 to the multi-level cell 102 as shown in FIG. 6. As will be explained in more detail below, applying a piggyback pulse using voltage control allows all $2^N$ levels to be programmed as a group thus drastically reducing the programming time. Though program time is reduced, this new methodology does not have a detrimental effect on program accuracy or cell reliability.

As shown in FIG. 6, piggyback programming begins with the highest level vt and steps its way down. Each step will reduce the program voltage in accordance to the level needed for the specific vt target. In FIG. 6, an example of programming of a memory cell with two bits is illustrated. The example takes into account that cell examination shows that the effective program strength doubles for every 0.5V added to the program voltage. Cell examination also indicates that it takes 4 times the work to program level B as level C bits. With the above said, the piggyback program voltage will step from 20, 19 and 18 volts. The high level voltage of 20 volts is explained by the fact that the high level C takes 4 times the work of level B and 16 times the work of level A. In addition, if it takes 10 pulses to program level A at 18V, it will take 40 pulses to program level B with the same voltage. At each step, specific bits will be enabled for programming. Of course, other values for the voltages of the pulses are possible depending on the desired speed of programming.

Figure 8:
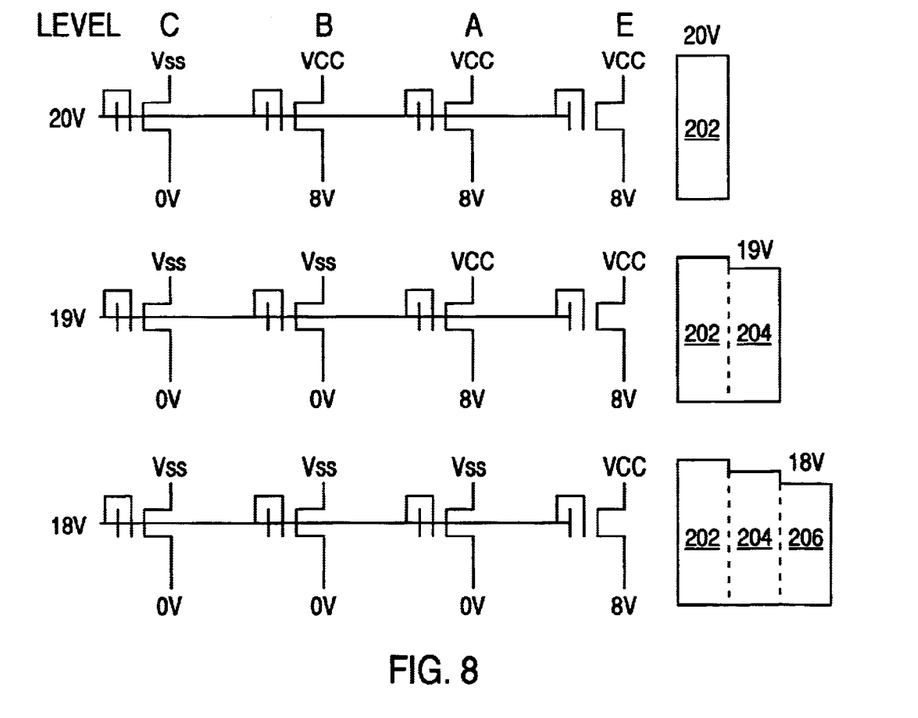
FIG. 8 schematically shows a mode of programming and program-verifying the flash memory array of FIG. 1 with the "piggyback" pulse and program-verify pulse of FIG. 7.

As shown in FIG. 8, the initial portion 202 of the pulse 200 has a voltage of 20 volts that corresponds to the vt value of level C. Thus, the initial portion 202 programs the level C data. During the application of portion 202, the bit line corresponding to level C is the only bit line uninhibited and selected for programming. The bit-lines corresponding to levels A and B are inhibited.

Upon completion of the initial portion 202 of the pulse 200, a second portion 204 of the pulse is applied. The second portion 204 is lowered to a program voltage of 19V that corresponds to the vt value of level B. During application of the second portion 204 of the pulse 200, a voltage Vss is applied to the bit line corresponding to level B so as to drain charge. The level B and level C bit-lines are both selected for programming during application of the second portion 204. This is not a problem because the level C bits are much harder to program at this stage and the second portion 204 will assist in level C programming. During application of the second portion 204, the bit lines corresponding to level A and the Erase State level are inhibited.

Upon completion of the second portion 204, a third portion 206 of the pulse is applied. The third portion 206 is lowered to a program voltage of 18V that corresponds to the vt value of level A. During application of the third portion 206 of the pulse 200, a voltage Vss is applied to the bit line corresponding to level A so as to drain charge. During application of the third portion 206, all three of the bit lines corresponding to the levels A, B and C are selected for programming. The level B and C bits are much harder to program at this stage and the third portion 204 will assist in level B and C programming. During application of the third portion 204, only the bit line corresponding to the Erase State level is inhibited.

After the pulse 200 is complete, the word-line and bit-line are discharged.

In summary, programming includes the following principles:

1) When a bit-line has been uninhibited, the word-line voltages must be re-applied to inhibit. The coupling only occurs when word-lines are raised to the high voltages.
2) A bit-line can always be uninhibited by applying Vss to drain the charge away.

Key to successful multi-level cell operation is controlled program vt distributions. Hump width and spacing must fall within target windows for correct data storage and long term reliability. To achieve this programming control, a specific program pulse target is usually required. For example, 10–15 μsec pulses can be used to program level within a 250 mv distribution. The program voltage will then be set to insure 10 pulses during level B programming. The applied program voltages are adjusted so that all vt levels complete programming after the targeted number of piggyback pulses 200. There are several setup and discharge concerns when applying the high voltage. Also the rise and fall times of the applied program pulse can be significant.

One of the advantages of the above-described piggyback programming with voltage control process is that it provides significant program saving when compared with known programming that uses separate pulses to program each vt level individually. In the case of the cell 102 having three voltage levels A–C, if it takes 10 program pulses to complete each level using separate standard pulses (30 total program pulses), only 10 Piggyback pulses 200 will be needed for programming each vt level. Each of the ten Piggyback pulses 200 will have a total width W that equals N*SBT/10. This results in the total program time will be 10*W which turns out to be equal to 10*(N*SBT/10). Consequently, the total program time will now be N*(SBPT) instead of $2^N-1$*(SBPT). The reduction in programming time is the result of voltage control of the pulse 200 allows all $2^N-1$ levels to be programmed as a group instead of separately. Such group programming allows significant savings in all cursory functions needed for high voltage programming. Note that in the case of using multiple piggyback programming pulses for programming, the frequency of the piggyback programming pulses will of course depend on the verify pulse timing.

Figure 7:
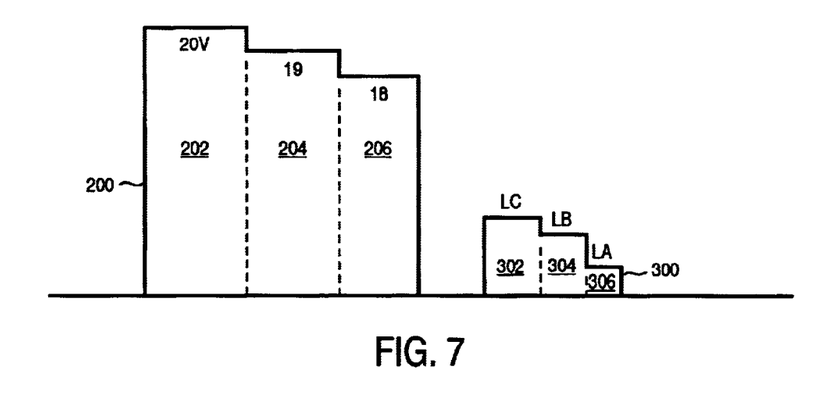
FIG. 7 shows the "piggyback" pulse of FIG. 6 along with a corresponding program-verify pulse that is used with a mode of programming in accordance with the present invention.

For reasons similar to those described above with respect to FIG. 5, each piggyback pulse 200 is followed by a program verify pulse 300. The specific details of piggyback programming is discussed in U.S. patent application Ser. No. 09/779,821, entitled "Piggyback Programming Using Voltage Control For Multi-Level Cell Flash Memory Designs" by Allan Parker (Brinks Hofer Case No. 9076/567 and AMD Case No. F0919) filed concurrently with the present application and the details of staircase program verify is discussed in U.S. patent application Ser. No. 09/794,482, entitled "Staircase Program Verify For Multi-Level Cell NAND Flash Designs," by Allan Parker (Brinks Hofer Case No. 9076/573 and AMD Case No. F0925) the entire contents of each of the above mentioned patent applications are incorporated herein by reference. The combination of the 2 mechanisms allows for a ganged program approach as schematically shown in FIG. 7. All levels share the same program pulse 200 and program verify pulse 300. As shown in FIG. 7, the program-verify pulse 300 has a staircase shape. Using the same assumptions as in the previous example, there will be only 10 program and 10 program-verify pulses to program all $2^N-1$ levels concurrently in a multi-level cell design. This reduces program time and allows for any multi-level cell density and is scaleable at run-time. Using this ganged approach, the program time for $2^N-1$ levels is comparable to the single bit time per stored bit. Furthermore, the program performance does not come at the expense of reliability or program margins.

Figure 5:
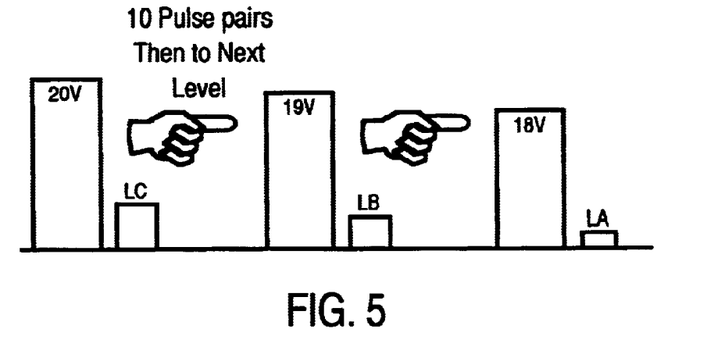
FIG. 5 schematically shows a known programming and program-verifying process where each level of the multi-level cell used in the flash memory array of FIG. 1 is programmed separately.

Two examples of the saving in programming time are given below. First, the program pulse times will be calculated for when using standard programming pulses such as shown in FIG. 5 versus when using piggyback programming pulses as shown in FIG. 7. The actual applied program pulse can be as small as ⅓ of the program pulse time. For example, a 15 μsec program pulse may have as little as 5 μsec effective program time assuming a 5 μsec set-up/rise time and a 5 μsec discharge/fall time for the pulse. This is due to setup and discharge times needed to pass high voltage to the selected bit-cell. To calculate relative program pulse times assume a standard pulse time of 20 usec with an effective pulse width of 10 usec. Furthermore, it will be assumed that each level requires 10 pulses to complete.

Standard Program Pulse Time = (#of levels) * (#of pulses) * (pulse width)

Standard 1-bit = 1 * 10 * 20 μsec = 200 μsec
Standard 2-bit = 3 * 10 * 20 μsec = 600 μsec
Standard 3-bit = 7 * 10 * 20 μsec = 1400 μsec
Standard 4-bit = 15 * 10 * 20 μsec = 3000 μsec Piggyback pulse time will be 20 μsec (level C standard pulse portion 202)+8 μsec (level B portion 204)+7.5 μsec (level A portion 206)=35.5 μsec. The 20 μsec portion includes the same setup and discharge penalty as in one standard program pulse. The rest of the pulse time includes the width of the extra steps for remaining levels. For a 3-bit design, the ganged pulse will be ~62 μsec as the result of an initial portion and six subsequent portions. (20 μsec+6*7 μsec, wherein 7 μsec denotes the average width of the six subsequent portions). A 4-bit ganged pulse is ~90 μsec as a result of an initial portion and fifteen subsequent portions. (20 μsec+15*5 μsec, wherein 5 μsec represents the average width of the fifteen subsequent portions).

Ganged Program Pulse Time = (#of pulses) * (Ganged pulse width)

Ganged 2-bit = 10 * 35.5 = 355 μsec
Ganged 3-bit = 10 * 62 = 620 μsec
Ganged 4-bit = 10 * 90 = 900 μsec Next the program verify pulse times will be calculated for when using standard program verify pulses such as shown in FIG. 5 versus when using the staircase program verify pulses as shown in FIG. 7. The actual program verify pulse width can account for only ½ of the program evaluation time. For example, a design with a 4 μsec evaluation pulse can have a 8 μsec program verify time. The added time is a result of setup and discharge concerns. For the calculations below, an 8 μsec verify time will be assumed with an effective 4 μsec pulse width. An example of a staircase program verify pulse 300 for a 2-bit design is shown in FIG. 7 where portion 302 has a portion LC having a voltage of approximately 2.1V and a width of approximately 8 μsec, a portion 304 having a voltage of approximately 1.2V and a width of approximately 2 μsec and a portion 306 having a voltage of approximately 0.4V and a width of approximately 2 μsec resulting in a total time of 12 μsec. A 3-bit ganged verify pulse will be 8 μsec+(6*2 μsec)=20 μsec). A 4-bit ganged verify pulse will be ~36 μsec. The ganged verify pulses will incur the setup and discharge penalties once for all levels.

Standard Program Verify Time = (#of levels) * (#of pulses) * (#pulse width)

Standard 1-bit = 1 * 10 * 8 μsec = 80 μsec
Standard 2-bit = 3 * 10 * 8 μsec = 240 μsec
Standard 3-bit = 7 * 10 * 8 μsec = 569 μsec
Standard 4-bit = 15 * 10 * 8 μsec = 1200 μsec Ganged Program Verify Time = (#of pulses) * (Ganged pulse width)

-continued

```
Ganged 2-bit = 10 * 12 µsec = 120 µsec
Ganged 3-bit = 10 * 20 µsec = 200 µsec
Ganged 4-bit = 10 * 36 µsec = 360 µsec
```

Table 2 below summarizes the total program times for the various combinations. The total program time includes the program pulse time and the program-verify time. The times are listed as totals and per bit. The per bit time gives an indication of overall performance. For example, a 3-bit design is programming 3 times the amount of data. The program time should be normalized for comparison to single bit program times.

Table 2 indicates the ganged performance per bit is better than the standard single bit program efficiency for a 2 or 3 bit design. The 4-bit performance is comparable to a single bit performance. These numbers are not meant to be absolutes but are indicative of savings that can be seen with ganged programming.

TABLE 2

| Storage Format | Total time (µsec) | Program time/bit (µsec/bit) |
|---|---|---|
| Standard 1-bit | 280 | 280 |
| Standard 2-bit | 840 | 420 |
| Standard 3-bit | 1960 | 653 |
| Standard 4-bit | 4200 | 1050 |
| Ganged 2-bit | 475 | 238 |
| Ganged 3-bit | 820 | 273 |
| Ganged 4-bit | 1260 | 315 |

Since all the above methodologies complete in equivalent pulse counts (10), the resultant program vt distributions will be identical. The program performance increase is achieved without affecting reliability.

The foregoing description is provided to illustrate the invention, and is not to be construed as a limitation. Numerous additions, substitutions and other changes can be made to the invention without departing from its scope as set forth in the appended claims.

I claim:

1. A method of program verifying a memory cell that has $2^N$ voltage levels where N>1 and represents the number of bits stored within said memory cell, the method comprising:
generating a an individual program verify pulse; and
program verifying at least two of said $2^N$ voltage levels with said individual program verify pulse.

2. The method of claim 1, wherein said program verifying comprises program verifying all but one of said $2^N$ voltage levels with said program verify pulse.

3. The method of claim 1, wherein said program verify pulse comprises stepped portions.

4. The method of claim 1, wherein there are $2^N-1$ levels.

5. The method of claim 3, wherein each of the $2^N-1$ levels has a voltage that corresponds to the one of said voltage levels.

6. The method of claim 1, wherein said memory cell comprises an EEPROM memory cell.

7. The method of claim 1, wherein said memory cell comprises am flash EEPROM memory cell.

8. A method of program verifying a memory cell, the method comprising:
generating an individual program verify pulse comprising stepped portions; and
program verifying said memory cell with said individual program verify pulse.

9. The method of claim 8, wherein the memory cell has $2^N$ voltage levels where N>1 and represents the number of bits stored within said memory cell.

10. The method of claim 9, wherein there are $2^N-1$ levels.

11. The method of claim 10, wherein each of the $2^N-1$ levels has a voltage that corresponds to one of said voltage levels.

12. The method of claim 8, wherein said memory cell comprises an EEPROM memory cell.

13. The method of claim 8, wherein said memory cell comprises a flash EEPROM memory cell.

14. A method of program verifying a multi-level cell flash memory array that comprises individual multi-level memory cells, wherein each of said individual memory cells comprises a drain connected to a bitline, a source connected to a voltage source Vss and a gate connected to a wordline, the method comprising:
uninhibiting only a bitline corresponding to a voltage level of one of said individual multi-level memory cells;
applying an individual multi-step program verify pulse to said uninhibited bitline; and
program verifying said voltage level with said individual multi-step program verify pulse.

15. The method of claim 14, comprising inhibiting said uninhibited bitline by applying a voltage to the word line corresponding to said one of said individual multi-level memory cells.

16. The method of claim 14, wherein said uninhibiting comprises applying a voltage Vss to the bitline corresponding to the voltage level of said one of said individual multi-level memory cells to drain the charge away.

17. The method of claim 14, further comprising discharging said word line and bit line after said multi-step program verify pulse is complete.

18. The method of claim 14, further comprising:
uninhibiting a second bitline corresponding to a second voltage level of said one of said individual multi-level memory cells;
applying said multi-step program verify pulse to said uninhibited second bitline; and
program verifying said second voltage level with said multi-step program verify pulse.

19. The method of claim 18, wherein program verifying of said first voltage level continues during said program verifying said second voltage level.

20. The method of claim 14, wherein said one of said individual multi-level memory cells contains N bits of data, wherein N>0.

21. The method of claim 20, wherein the multi-step program verify pulse has $2^N-1$ levels.

22. The method of claim 21, wherein each of the $2^N-1$ levels has a voltage that corresponds to one of said voltage levels.

23. The method of claim 14, wherein said memory cell comprises an EEPROM memory cell.

24. The method of claim 14, wherein said memory cell comprises a flash EEPROM memory cell.

25. A method of programming and program verifying a memory cell that has $2^N$ voltage levels where N>1 and represents the number of bits stored within said memory cell, the method comprising:
generating an individual programming pulse;
generating an individual program verify pulse;
programming at least two of said $2^N$ voltage levels with said individual programming pulse; and program verifying at least two of said $2^N$ voltage levels with said individual program verify pulse.

26. The method of claim 25, wherein said programming comprises programming all but one of said $2^N$ voltage levels with said programming pulse and said program verifying comprises program verifying all but one of said $2^N$ voltage levels with said program verify pulse.

27. The method of claim 25, wherein said programming pulse and said program verify pulse each comprises stepped portions.

28. The method of claim 27, wherein there are $2^N-1$ levels for each of said programming pulse and said program verify pulse.

29. The method of claim 28, wherein each of the $2^N-1$ levels of said programming pulse and said program verify pulse has a voltage that corresponds to one of said voltage levels.

30. The method of claim 25, wherein said memory cell comprises an EEPROM memory cell.

31. The method of claim 25, wherein said memory cell comprises a flash EEPROM memory cell.

32. A method of programming and program verifying a memory cell, the method comprising:
generating an individual programming pulse comprising stepped portions;
generating an individual program verify pulse comprising stepped portions;
programming said memory cell with said individual programming pulse; and
program verifying said memory cell with said individual program verify pulse.

33. The method of claim 32, wherein the memory cell has $2^N$ voltage levels where N>1 and represents the number of bits stored within said memory cell.

34. The method of claim 33, wherein there are $2^N-1$ levels for each of said programming pulse and said program verify pulse.

35. The method of claim 34, wherein each of the $2^N-1$ levels of said programming pulse and the program verify pulse has a voltage that corresponds to one of said voltage levels.

36. The method of claim 32, wherein said memory cell comprises an EEPROM memory cell.

37. The method of claim 32, wherein said memory cell comprises a flash EEPROM memory cell.

38. A method of program verifying a multi-level cell flash memory array that comprises individual multi-level memory cells, wherein each of said individual memory cells comprises a drain connected to a bitline, a source connected to a voltage source Vss and a gate connected to a wordline, the method comprising:
uninhibiting only a bitline corresponding to a voltage level of one of said individual multi-level memory cells;
applying an individual multi-step programming pulse to said uninhibited bitline;
programming said voltage level with said individual multi-level programming pulse;
applying an individual multi-step program verify pulse to said uninhibited bitline; and
program verifying said voltage level with said individual multi-step program verify pulse.

39. The method of claim 38, comprising inhibiting said uninhibited bitline by applying a voltage to the word line corresponding to said one of said individual multi-level memory cells.

40. The method of claim 38, wherein said uninhibiting comprises applying a voltage Vss to the bitline corresponding to the voltage level of said one of said individual multi-level memory cells to drain the charge away.

41. The method of claim 38, further comprising discharging said word line and bit line after said multi-step programming pulse and multi-step program verify pulse are complete.

42. The method of claim 38, further comprising:
uninhibiting a second bitline corresponding to a second voltage level of said one of said individual multi-level memory cells;
applying said multi-step programming pulse to said uninhibited second bitline;
programming said second voltage level with said multi-step programming pulse;
applying said multi-step program verify pulse to said uninhibited second bitline; and
program verifying said second voltage level with said multi-step program verify pulse.

43. The method of claim 42, wherein programming and program verifying of said first voltage level continues during said programming and program verifying said second voltage level.

44. The method of claim 38, wherein said one of said individual multi-level memory cells contains N bits of data, wherein N>0.

45. The method of claim 44, wherein the multi-step programming pulse and the multi-step program verify pulse each has $2^N-1$ levels.

46. The method of claim 45, wherein each of the $2^N-1$ levels of the multi-step programming pulse and the multi-step program verify pulse has a voltage that corresponds to one of said voltage levels.

47. The method of claim 38, wherein said memory cell comprises an EEPROM memory cell.

48. The method of claim 38, wherein said memory cell comprises a flash EEPROM memory cell.

* * * * *